(12) United States Patent
Tuttle

(10) Patent No.: US 10,261,123 B2
(45) Date of Patent: Apr. 16, 2019

(54) SEMICONDUCTOR DEVICE STRUCTURES FOR BURN-IN TESTING AND METHODS THEREOF

(71) Applicant: Micron Technology, Inc., Boise, ID (US)

(72) Inventor: Mark E. Tuttle, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 15/685,997

(22) Filed: Aug. 24, 2017

(65) Prior Publication Data

US 2019/0064257 A1    Feb. 28, 2019

(51) Int. Cl.
| | |
|---|---|
| *G01R 31/28* | (2006.01) |
| *H01L 23/538* | (2006.01) |
| *H01L 23/498* | (2006.01) |
| *H01L 23/00* | (2006.01) |
| *G01R 31/02* | (2006.01) |

(52) U.S. Cl.
CPC ..... *G01R 31/2855* (2013.01); *G01R 31/2863* (2013.01); *H01L 23/49811* (2013.01); *H01L 23/5389* (2013.01); *H01L 24/95* (2013.01); *G01R 31/02* (2013.01); *H01L 2223/54473* (2013.01); *H01L 2224/04105* (2013.01); *H01L 2924/014* (2013.01)

(58) Field of Classification Search
CPC .......... H01L 23/49811; H01L 23/5389; G01R 31/2863

See application file for complete search history.

(56) References Cited

U.S. PATENT DOCUMENTS

| | | | |
|---|---|---|---|
| 2006/0181298 A1* | 8/2006 | Farnworth | G01R 31/2886 324/750.03 |
| 2009/0045524 A1* | 2/2009 | Mohammed | H01L 23/13 257/777 |
| 2010/0007019 A1* | 1/2010 | Pendse | H01L 21/563 257/737 |

* cited by examiner

*Primary Examiner* — Jermele M Hollington
*Assistant Examiner* — Alvaro Fortich
(74) *Attorney, Agent, or Firm* — Perkins Coie LLP

(57) ABSTRACT

A semiconductor device structure is provided. The semiconductor device structure includes a substrate, an electrical connection structure extending upwardly from an upper surface of the substrate by a first height, and a contact pad electrically disposed on the upper surface of the substrate. The contact pad has a solder-wettable surface with an area configured to support a solder ball having a second height at least twice the first height. The semiconductor device structure further includes a fuse element with a first end electrically coupled to the electrical connection structure and a second end electrically coupled to the contact pad.

24 Claims, 5 Drawing Sheets

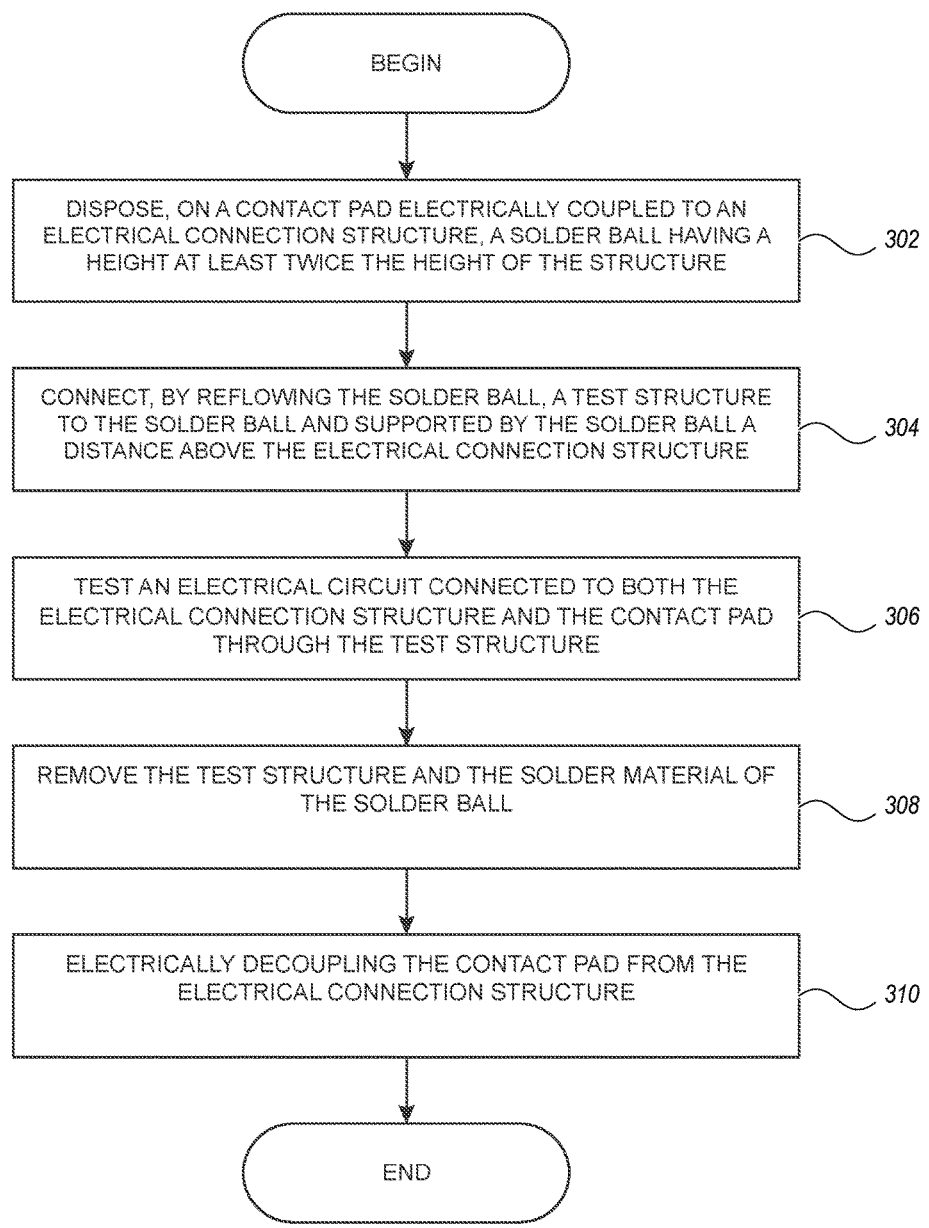

SEMICONDUCTOR DEVICE STRUCTURES FOR BURN-IN TESTING AND METHODS THEREOF

TECHNICAL FIELD

The present disclosure generally relates to semiconductor devices, and more particularly relates to semiconductor device structures for burn-in testing and methods thereof.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include functional features, such as memory cells, processor circuits, and/or imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the functional capacity of a semiconductor package without substantially increasing the surface area covered thereby (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies. In anticipation of electrically coupling such dies, the bond pads of dies may be provided with an electrical connection structure, such as a pillar extending upwardly from a bond pad of the die, before the dies are assembled into a package.

To avoid packaging a defective or "bad" die with a number of working or "good" dies (and thereby potentially rendering all of the dies in a package unusable), dies may be tested before assembly to identify good and bad dies. One test used to identify known good dies is a burn-in test, in which multiple (e.g., many, or even all) of the electrical circuits of a die are exercised for an extended duration, optionally at an elevated device temperature (e.g., provided by conducting the burn-in testing in a burn-in oven or with another heating apparatus). As the complexity of the integrated circuits within semiconductor dies continues to increase, along with the number of electrical connection structures used for interconnecting multiple dies, the scale of the electrical connection structures has continued to shrink to such a degree that the act of electrically connecting the electrical connection structures to a testing device (e.g., with probe pins or the like) can irreparably damage the electrical connection structure. Accordingly, it is desirable to provide methods and structures for testing semiconductor devices in a way that prevents damage to electrical connection structures used for connecting a die in a semiconductor device package.

BRIEF DESCRIPTION OF THE DRAWINGS

FIG. 3 is a flow chart illustrating a method of testing a semiconductor device in accordance with an embodiment of the present technology.

DETAILED DESCRIPTION

Figure 1:
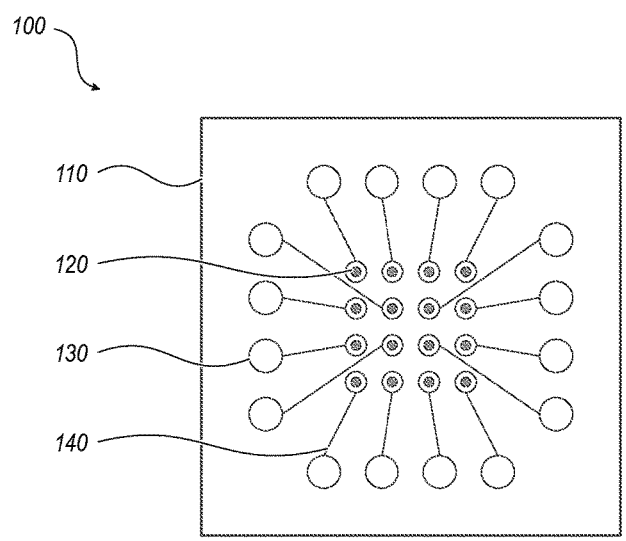
FIG. 1 illustrates a semiconductor device in accordance with an embodiment of the present technology.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices may be designed with small and delicate electrical connection structures which pose a challenge for device testing due to their small size and/or close spacing, especially for testing multiple such electrical connection structures simultaneously (e.g., during a burn-in test). Accordingly, several embodiments of semiconductor devices in accordance with the present technology can provide semiconductor devices with structures for burn-in testing.

Several embodiments of the present technology are directed to semiconductor devices comprising electrical connection structures and contact pads. In one embodiment, a semiconductor device structure includes a substrate, an electrical connection structure extending upwardly from an upper surface of the substrate by a first height, and a contact pad electrically disposed on the upper surface of the substrate. The contact pad has a solder-wettable surface with an area configured to support a solder ball having a second height at least twice the first height. The semiconductor device structure further includes a fuse element with a first end electrically coupled to the electrical connection structure and a second end electrically coupled to the contact pad.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

FIG. 1 illustrates a semiconductor device 100 in accordance with an embodiment of the present technology. The semiconductor device 100 includes a plurality of electrical connection structures 120 extending upward from an upper surface of a substrate 110. To facilitate testing of the electrical circuits within the semiconductor device 100 to which the electrical connection structures 120 are electrically coupled, the semiconductor device 100 further includes a plurality of contact pads 130, each electrically coupled to a corresponding one of the plurality of electrical connection structures 120. As set forth above, the electrical connection structures 120 may be manufactured at such a small scale and/or with such a high density, that directly connecting test equipment to the electrical connection structures 120 could irreparably damage them (e.g., rendering them unsuitable for electrically connecting the semiconductor device 100 to another device in a semiconductor device package). By electrically coupling contact pads 130 to the electrical connection structures 120 with traces 140 (e.g., formed in one or more redistribution layers), the test equipment can be connected to the contact pads 130 instead, preserving the electrical connection structures 120 from damage.

While circuits of the semiconductor device 100 can be tested separately (e.g., by connecting to only one or a few contact pads 130 simultaneously with test equipment), testing all of the circuits of the semiconductor device 100 in a single operation (e.g., by connecting to all of the circuits simultaneously) can provide a high degree of assurance that a die is fully functional. To ensure that all of the circuits to be tested are electrically coupled in a reliable fashion to the test equipment, it may be desirable to utilize a more robust connection than that provided by the mechanical interaction of a probe pin with a contact pad 130. In accordance with one aspect of the present technology, the semiconductor device 100 can be electrically coupled to test equipment by robust, semi-permanent solder joints that can maintain electrical connectivity for the duration of a thorough test (e.g., a burn-in test) as set forth in greater detail below.

Figure 2A:
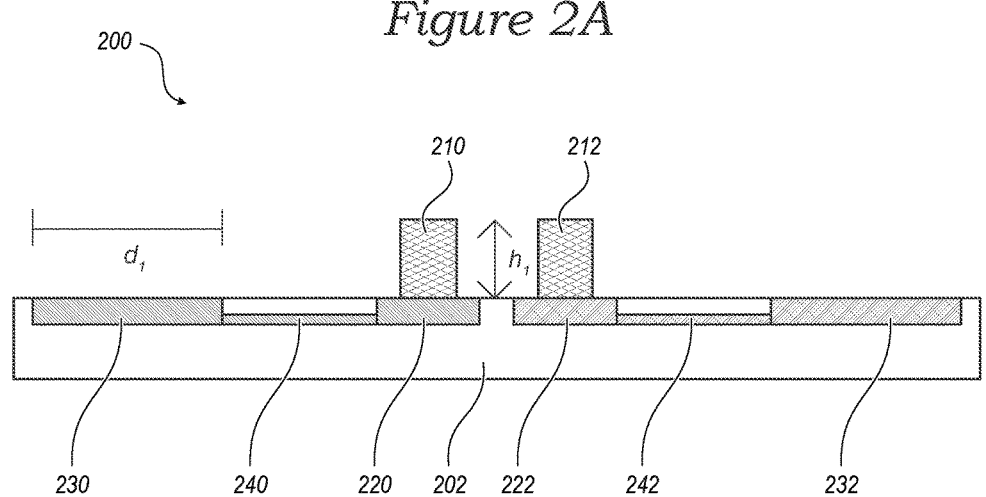
FIGS. 2A-2E illustrates a semiconductor device at various stages of manufacture and testing in accordance with an embodiment of the present technology.

Turning to FIG. 2A, a semiconductor device 200 is illustrated in partial cross-section in accordance with an embodiment of the present technology. As can be seen with reference to FIG. 2A, the semiconductor device 200 includes a substrate 202 on which are disposed electrical connection structures 210 and 212. The electrical connection structures 210 and 212 extend upwardly from an upper surface of the substrate 202 by a height $h_1$. In accordance with an embodiment of the present technology, the electrical connection structures 210 and 212 can be pillars grown on pads 220 and 222, respectively, for connecting to another semiconductor device in a semiconductor device package. For example, the electrical connection structures 210 and 212 can be copper micro-pillars each having a height $h_1$ between about 5 and 30 µm, and a diameter of between about 5 and 30 µm. Due to the very small scale of the electrical connection structures 210 and 212, directly electrically coupling them to a test device (e.g., a probe pin, a test board, etc.) can cause unacceptable amounts of damage (e.g., that would prevent reliable electrical connectivity with other devices in a semiconductor package to which the semiconductor device 200 was electrically coupled). Accordingly, semiconductor device 200 includes contact pads 230 and 232, electrically coupled to respective ones of the electrical connection structures 210 and 212 by respective traces 240 and 242.

To facilitate a reliable electrical connection to a test device (e.g., a test board used to conduct a burn-in test), the contact pads 230 and 232 each have an area (e.g., a shape and size) configured to support a solder ball having a height greater than the height $h_1$ of the electrical connection structures 210 and 212, such that the test device can be prevented from contacting (and potentially damaging) the electrical connection structures 210 and 212. The contact pads 230 and 232 can be formed of, or coated with, a solder-wettable material (e.g., copper, nickel, alloys thereof, etc.) to facilitate the formation and support of solder balls. For example, the contact pads 230 and 232 can each have an area (e.g., a circular shape with a diameter $d_1$) configured to support a solder ball of a known material having a height at least twice the height $h_1$ of the electrical connection structures 210 and 212.

As will be readily apparent to one skilled in the art, in other embodiments of the present technology, the contact pads 230 and 232 need not be circular, or even all have the same shape or size. Moreover, the height of the solder ball that the contact pads 230 and 232 are configured to support can be a height other than twice the height $h_1$ of the electrical connection structures 210 and 212. For example, in another embodiment, the contact pads 230 and 232 can each have an area (e.g., one or more of any number of different polygonal, elliptical or irregular shapes with various surface areas) configured to support a solder ball having a height at least three times the height $h_1$ of the electrical connection structures 210 and 212. While in the foregoing examples, the contact pads have been described as having an area configured to support a solder ball having a height at least two or three times the height of the electrical connection structures, one skilled in the art will readily understand that the contact pads can have areas configured to support solder balls with any one of a number of other heights. For example, the contact pads can have an area configured to support solder balls with a height at least greater than the height of the electrical connection structures, a height at least 50% greater than the height of the electrical connection structures, a height at least 300% greater than the height of the electrical connection structures, and so on. By providing the contact pads with areas configured to support solder balls with greater heights, the distance between the test structure and the electrical connection structures can be increased, although at the cost of greater die area. Accordingly, the area (e.g., shape and size) of the contact pads can be configured to achieve a desired balance between safely spacing a test structure from the electrical connection structures and a die area consumed by the contact pads.

Figure 2B:
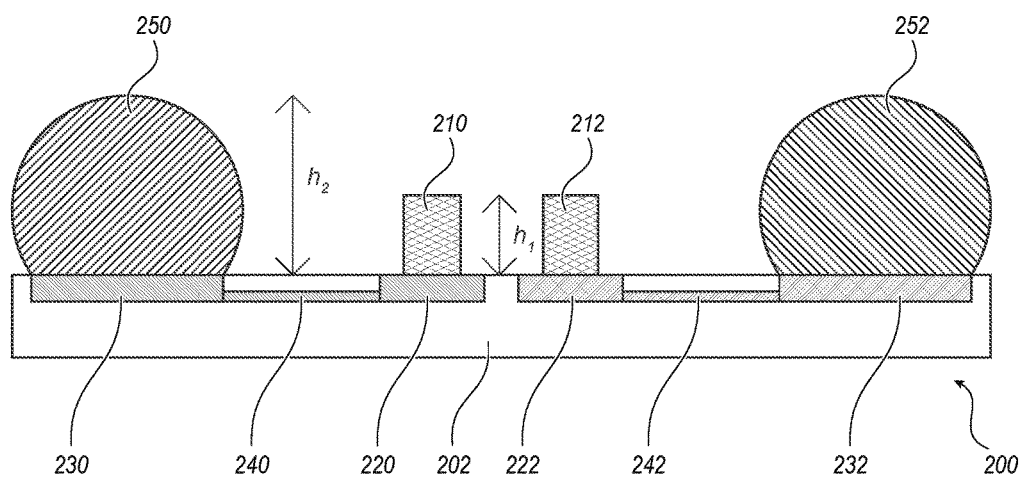

Turning to FIG. 2B, the semiconductor device 200 is illustrated in partial cross-section after solder balls have been formed on the contact pads thereof, in accordance with an embodiment of the present technology. As can be seen with reference to FIG. 2B, the area (e.g., the size and/or shape of the solder-wettable material) of contact pads 230 and 232 is such that solder balls 250 and 252 formed thereon have a height $h_2$ which is sufficient to prevent a test device connected thereto from contacting the electrical connection structures 210 and 212. For example, if the test device includes a test board with a number of contact pads lying in a planar surface, the height $h_2$ of the solder balls 250 and 252 can ensure that the planar surface remains supported above and/or vertically separated from the uppermost surface of the electrical connection structures 210 and 212. If the test device includes a number of pins, pillars, or other protruding structures, the height $h_2$ of the solder balls 250 and 252 can ensure that the protruding structures can be reliably coupled to the solder without contacting the electrical connection structures 210 and 212.

Figure 2C:
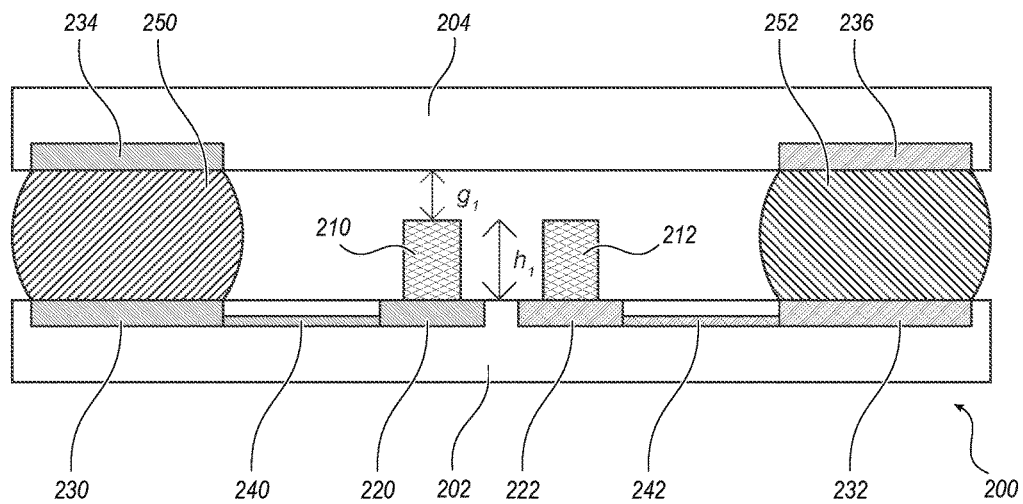

FIG. 2C illustrates the semiconductor device 200 in partial cross-section after a test board has been connected to the solder balls formed thereon, in accordance with an embodiment of the present technology. As can be seen with reference to FIG. 2C, test board 204 includes contact pads 234 and 236 corresponding to (e.g., aligned with) the contact pads 230 and 232 of the semiconductor device 200. The contact pads 234 and 236 of the test board 204 can be connected (e.g., via leads, vias, or other redistribution structures) to electrical circuits configured to test the performance and reliability of the semiconductor device 200. The use of a test board 204 connected by robust solder connections to the semiconductor device 200 can permit the burn-in testing of the semiconductor device 200 in a burn-in oven, to ensure that the semiconductor device 200 is a known good die, without disturbing the electrical connection structures 210 and 212.

In the present embodiment illustrated in FIG. 2C, the solder balls 250 and 252 are disposed on opposing peripheral sides of the electrical connection structures 210 and 212. This arrangement permits the solder balls 250 and 252 to support a substantially planar test structure (e.g., such as test board 204) on opposing sides of the electrical connection structures 210 and 212, such that the test structure can stably "bridge" the electrical connection structures 210 and 212. Referring back to FIG. 1, it can be seen that providing contact pads 130 peripherally around a central region in which electrical connection structures 120 are disposed can provide stability in multiple axes of rotation (e.g., preventing a test structure from rotating around either orthogonal axis in the plane of FIG. 1). Of course, while the foregoing exemplary embodiments have illustrated contact pads on opposing sides of electrical connection structures, those skilled in the art will readily understand that other arrangements of contact pads and electrical connection structures can be used. For example, additional contact pads can be provided amongst a field of electrical connection structures (e.g., to provide additional stability to resist flexion of a test structure), or on a single side adjacent electrical connection structures (e.g., when the test structure does not extend over the electrical connection structures, or when the opposite side of the electrical connection structures includes some support other than a solder ball disposed on a contact pad).

Referring again to FIG. 2C, with the solder balls 250 and 252 having been electrically connected to the contact pads 234 and 236 of the test board 204 and solidified, a gap $g_1$ remains between a surface of the test board 204 and the uppermost portions of the electrical connection structures 210 and 212. The amount of this gap $g_1$ can be controlled by varying the area (e.g., shape and size) of the contact pads 230 and 232 of the semiconductor device (which will vary the height $h_2$ of the solder ball 250 and 252 that each contact pad 230 and 232 is capable of supporting), the height $h_1$ of the electrical connection structures 210 and 212, the amount of solder material used to form solder balls 250 and 252, and the area (e.g., shape and size) of the contact pads 234 and 236 of the test board. By designing semiconductor device 200 and test board 204 to provide an adequately large gap $g_1$ to accommodate variations in the fabrication of these factors, the test board 204 or other test structure can be kept from contacting the electrical connection structures 210 and 212 during a testing operation, and thereby preserve them for use in the formation of interconnects between semiconductor device 200 and other devices in a semiconductor device package.

Figure 2D:
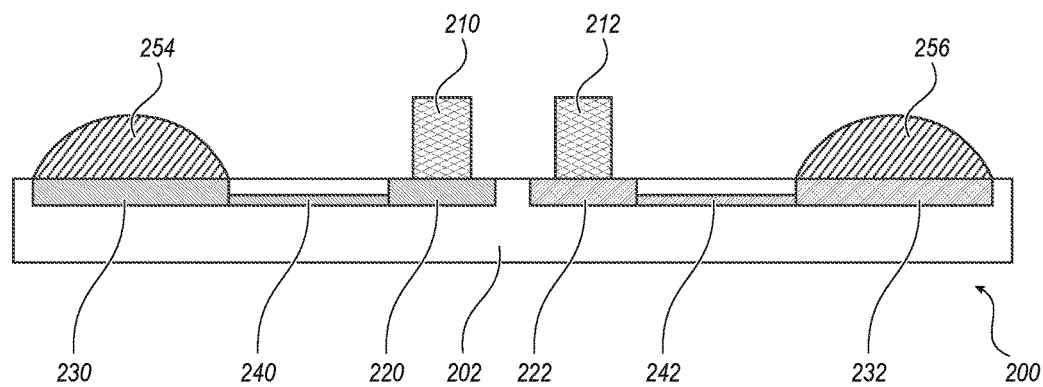

In accordance with one aspect of the present technology, after testing the circuits of the semiconductor device 200 by electrically coupling test equipment (e.g., a burn-in board, test probes, etc.) to the contact pads 230 and 232 with robust and semi-permanent solder joints, the test equipment can be disconnected from the semiconductor device 200 by reflowing the solder balls 250 and 252 and removing the test equipment. The removal of the test equipment may carry away some of the solder material of the solder balls 250 and 252, depending upon how much solder-wettable surface area the test equipment used to interface with the solder balls 250 and 252. For example, FIG. 2D illustrates the semiconductor device 200 in partial cross-section after the test board 204 has been removed therefrom, carrying with it some of the solder material from the solder balls formed thereon, in accordance with an embodiment of the present technology. It may be desirable to remove the remaining solder material 254 and 256 from contact pads 230 and 232 to prevent possible contamination or to facilitate later processing steps. Accordingly, the remaining solder material 254 and 256 can be removed from contact pads 230 and 232 using any one of a number of known solder-removal methods, including vacuum suction, wicking, scraping, etc.

Figure 2E:
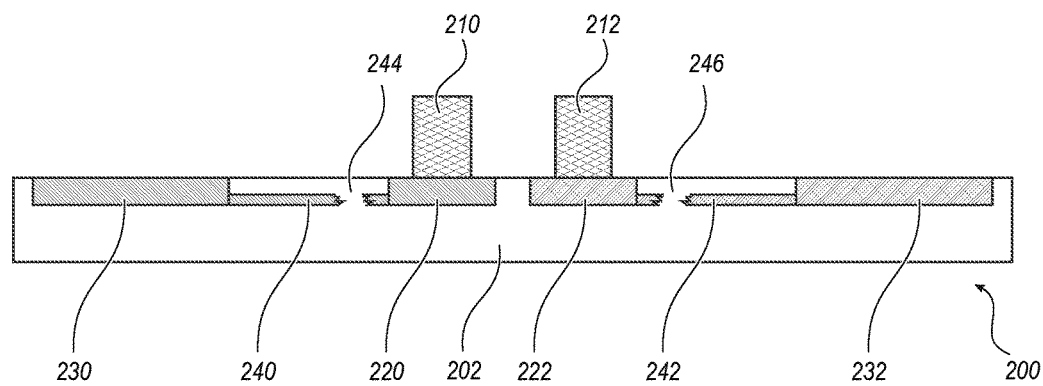

If contact pads 230 and 232 remain electrically coupled to the circuits in the semiconductor device 200 to which the electrical connection structures 210 and 212 are also electrically coupled, undesirable parasitic capacitance, inductance, and/or other undesirable effects may impact the performance of those circuits. Therefore, in accordance with one aspect of the present technology, it may be desirable to electrically decouple the contact pads 230 and 232 from the electrical connection structures 210 and 212 (e.g., and therefore from the circuits in the semiconductor device 200 to which the electrical connection structures 210 and 212 are also electrically coupled). In this regard, traces 240 and 242 can be fusible traces, or include fusible sections, so that both the contact pads 230 and 232 and possibly some portion of the traces 240 and 242 themselves can be electrically isolated from the circuits in the semiconductor device 200. For example, FIG. 2E illustrates the semiconductor device 200 in partial cross-section after the traces 240 and 242 have been fused to disconnect the contact pads 230 and 232 (as well as a portion of traces 240 and 242) from the electrical connection structures 210 and 212 (as well as from the circuits to which the electrical connection structures 210 and 212 are electrically coupled). By fusing the traces 240 and 242 as close to the electrical connection structures 210 and 212 as is practicable, the parasitic capacitance, inductance, and other undesirable electrical properties of traces 240 and 242 can be minimized.

While in the foregoing exemplary embodiment, traces 240 and 242 have been illustrated as fusible traces (e.g., including a fuse element configured to be current-blown, laser-blown, etc.), other well-known mechanisms for disconnecting circuit elements in a semiconductor device can also be used in place of, or in combination with, fusible traces. For example, if non-fusible traces are utilized, the contact pads (and at least a portion of the traces) can be electrically decoupled from the electrical connection structures by laser cutting, etching through, or otherwise mechanically removing a portion of the trace material to electrically isolate the contact pads and remaining trace material.

FIG. 3 is a flow chart illustrating a method of testing a semiconductor device with a plurality of electrical connection structures extending upwardly from an upper surface of the substrate by a first height in accordance with an embodiment of the present technology. The method includes disposing, on a plurality of contact pads electrically coupled to corresponding ones of the plurality of electrical connection structures, a corresponding plurality of solder balls having a second height at least twice that of the first height (box 302). The method also includes connecting, to the plurality of solder balls, a test structure (box 304), and electrically testing circuits of the semiconductor device through the test structure (box 306). The method can also include removing the test structure (e.g., by reflowing the solder junction formed from the solder balls) and the solder material (e.g., by wicking, vacuum suction, etc.) from the contact pads (box 308). The method can also include electrically decoupling the plurality of contact pads from the plurality of electrical connection structures (box 310).

Figure 4:
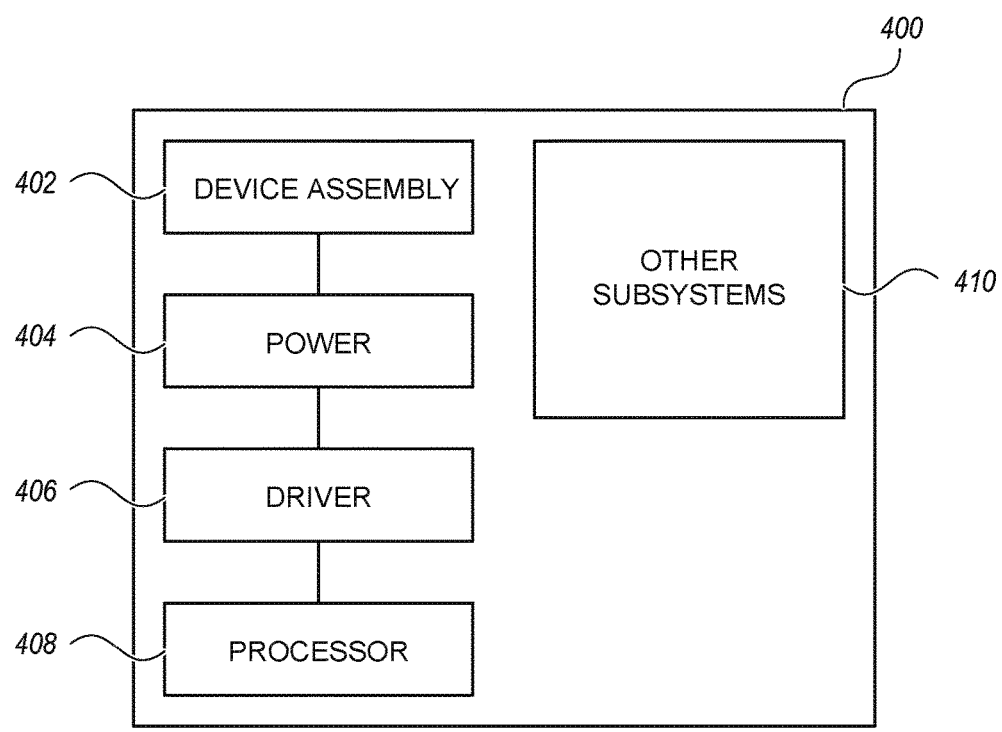
FIG. 4 is a schematic view showing a system that includes a semiconductor device configured in accordance with an embodiment of the present technology.

Any one of the semiconductor devices described above with reference to FIGS. 1-3 can be incorporated into any of a myriad of larger and/or more complex systems, a representative example of which is system 400 shown schematically in FIG. 4. The system 400 can include a semiconductor device assembly 402, a power source 404, a driver 406, a processor 408, and/or other subsystems or components 410. The semiconductor device assembly 402 can include features generally similar to those of the semiconductor devices described above with reference to FIGS. 1-3. The resulting system 400 can perform any of a wide variety of functions, such as memory storage, data processing, and/or other suitable functions. Accordingly, representative systems 400 can include, without limitation, hand-held devices (e.g., mobile phones, tablets, digital readers, and digital audio players), computers, vehicles, appliances and other products. Components of the system 400 may be housed in a single unit or distributed over multiple, interconnected units (e.g., through a communications network). The components of the system 400 can also include remote devices and any of a wide variety of computer readable media.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A semiconductor device structure, comprising:
a substrate;
an electrical connection structure extending upwardly from an upper surface of the substrate by a first height;
a contact pad electrically disposed on the upper surface of the substrate, the contact pad having a solder-wettable surface with an area configured to support a solder ball having a second height at least twice the first height; and
a fuse element with a first end electrically coupled to the electrical connection structure and a second end electrically coupled to the contact pad.

2. The semiconductor device structure of claim 1, wherein the first height is between about 5 and 30 µm.

3. The semiconductor device structure of claim 1, wherein the second height is greater than about 50 µm.

4. The semiconductor device structure of claim 1, wherein the electrical connection structure is a copper pillar having a diameter of between about 5 and 30 µm.

5. The semiconductor device structure of claim 1, wherein the area of the contact pad is a circle with a diameter of between about 10 and 50 µm.

6. The semiconductor device structure of claim 1, wherein the fuse element is laser-blowable fuse.

7. The semiconductor device structure of claim 6, wherein the laser-blowable fuse is proximate to the electrical connection structure.

8. The semiconductor device structure of claim 1, wherein the fuse element is a blown fuse element.

9. A semiconductor device structure, comprising:
a substrate;
a plurality of electrical connection structures extending upwardly from an upper surface of the substrate by a first height;
a plurality of contact pads disposed on the upper surface of the substrate on opposing sides of the plurality of electrical connection structures, each contact pad having a solder-wettable surface with an area configured to support a solder ball having a second height at least twice the first height; and
a plurality of fuse elements, each fuse element having a first end electrically coupled to a corresponding one of the plurality of electrical connection structures and a second end electrically coupled to a corresponding one of the plurality of contact pads.

10. The semiconductor device structure of claim 9, wherein the first height is between about 5 and 30 µm.

11. The semiconductor device structure of claim 9, wherein the second height is greater than about 50 µm.

12. The semiconductor device structure of claim 9, wherein the plurality of electrical connection structures comprise a plurality of copper pillars each having a diameter of between about 5 and 30 µm.

13. The semiconductor device structure of claim 9, wherein the area of each of the plurality of contact pads is a circle with a diameter of between about 10 and about 50 µm.

14. The semiconductor device structure of claim 9, wherein the plurality of fuse elements comprise a plurality of laser-blowable fuses.

15. The semiconductor device structure of claim 14, wherein each laser-blowable fuses is proximate to the corresponding one of the plurality of electrical connection structures.

16. The semiconductor device structure of claim 9, wherein the plurality of fuse elements comprise a plurality of blown fuse elements.

17. A method of testing a semiconductor device including a substrate with a plurality of electrical connection structures extending upwardly from an upper surface of the substrate by a first height, the method comprising:
disposing, on a plurality of contact pads electrically coupled to corresponding ones of the plurality of electrical connection structures and disposed on the upper surface of the substrate, a corresponding plurality of solder balls having a second height at least twice the first height;
connecting, to the plurality of solder balls, a test structure; and electrically testing circuits of the semiconductor device through the test structure.

18. The method according to claim 17, wherein connecting the test structure comprises reflowing the solder balls to form solder junctions between the plurality of contact pads and the test structure.

19. The method according to claim 17, wherein the test structure is supported by the solder junctions a third height above the plurality of electrical connection structures.

20. The method according to claim 17, further comprising reflowing the solder junctions to remove the test structure.

21. The method according to claim 17, further comprising removing the test structure and removing remaining solder from the plurality of contact pads.

22. The method according to claim 17, further comprising electrically decoupling the plurality of contact pads from the plurality of electrical connection structures.

23. The method according to claim 17, wherein first height is between about 5 and 30 μm.

24. The method according to claim 17, wherein the circuits are electrically tested in a burn-in oven.

* * * * *